(12) United States Patent
Chien et al.

(10) Patent No.: US 8,398,411 B2
(45) Date of Patent: Mar. 19, 2013

(54) SOCKET ASSEMBLY INCORPORATED WITH ROTATIONALLY MOUNTED PRESSING MEMBER

(75) Inventors: Cheng-Ching Chien, Tu-Cheng (TW); Nan-Hung Lin, Tu-Cheng (TW); Chih-Pi Cheng, Tu-Cheng (TW)

(73) Assignee: Hon Hai Precision Ind. Co., Ltd, New Taipei (TW)

( * ) Notice: Subject to any disclaimer, the term of this patent is extended or adjusted under 35 U.S.C. 154(b) by 463 days.

(21) Appl. No.: 12/686,392

(22) Filed: Jan. 13, 2010

(65) Prior Publication Data

US 2010/0178780 A1  Jul. 15, 2010

(30) Foreign Application Priority Data

Jan. 13, 2009  (TW) ................................ 98200513 U

(51) Int. Cl.
*H01R 12/00* (2006.01)
(52) U.S. Cl. ............................ 439/73; 439/331; 439/487
(58) Field of Classification Search .................. 439/65, 439/485, 487, 73, 331
See application file for complete search history.

(56) References Cited

U.S. PATENT DOCUMENTS

| | | | | |
|---|---|---|---|---|
| 4,376,560 | A | * | 3/1983 | Olsson et al. ................. 439/331 |
| 4,396,935 | A | * | 8/1983 | Schuck .......................... 257/706 |
| 4,461,524 | A | * | 7/1984 | McGhee ....................... 439/325 |
| 5,068,601 | A | * | 11/1991 | Parmenter ................ 324/756.02 |
| 5,378,970 | A | * | 1/1995 | Sato ........................ 324/756.02 |
| 5,579,827 | A | * | 12/1996 | Chung .......................... 165/80.3 |
| 5,741,141 | A | * | 4/1998 | O'Malley ....................... 439/73 |
| 6,256,202 | B1 | * | 7/2001 | Murphy ......................... 361/704 |
| 6,293,331 | B1 | * | 9/2001 | Wang ........................... 165/80.3 |
| 6,648,664 | B1 | * | 11/2003 | McHugh et al. .............. 439/331 |
| 6,981,882 | B1 | * | 1/2006 | Palaniappa ..................... 439/73 |
| 7,589,972 | B2 | | 9/2009 | Ma et al. |
| 7,619,895 | B1 | | 11/2009 | Wertz et al. |

\* cited by examiner

*Primary Examiner* — Tulsidas C Patel
*Assistant Examiner* — Travis Chambers
(74) *Attorney, Agent, or Firm* — Wei Te Chung; Ming Chieh Chang

(57) ABSTRACT

A socket assembly, comprising a socket, a package received in the socket, a pressing member arranged upon the package and downwardly pressing the package and two heat pipes attached to the pressing member. The pressing member is formed with four arch grooves along a peripheral thereof, and the arch grooves allow linking members to pass therethrough and rotatably retain the pressing member on a printed circuit board. Therefore, the pressing member can rotate in a certain range, by sliding the arch groove with respect to the linking member, to provide a flexible arrangement for heat pipes.

19 Claims, 6 Drawing Sheets

US 8,398,411 B2

SOCKET ASSEMBLY INCORPORATED WITH ROTATIONALLY MOUNTED PRESSING MEMBER

FIELD OF THE INVENTION

The present invention relates to a socket assembly for electrically connecting a package and a printed circuit board, and particularly to a socket assembly having a rotationally mounted pressing member.

DESCRIPTION OF RELATED ART

U.S. Pat. No. 7,589,972, issued to Ma et. al on Sep. 15, 2009, discloses a conventional socket assembly, which comprises a printed circuit board, a socket, a heat spreader, a pressing piece and heat pipes. The pressing piece is used for pressing against a package settled within the socket to get a reliable interconnection between the package and the socket. The pressing piece has a rectangular configuration and defines a circular hole in each corner thereof, screws are used to pass through the holes and retain the pressing piece to the printed circuit board; and the heat pipes are disposed upon or under the pressing piece. However, since the heat pipe is soldered to the heat spreader which is fixedly mounted, the relative positions and directions among the pressing piece, the heat pipes, and the heat spreader are specifically decided, with no variations.

However, different computers require the heat pipes to be positioned at different positions and directions such that a flexible solution has to be provided to meet the requirements.

Hence, an improved socket assembly is required to overcome the above-mentioned disadvantages of the related art.

SUMMARY OF THE INVENTION

An object of the present invention is to provide a socket assembly, which has a rotationally mounted pressing member providing a flexibly arranged platform for attaching heat pipes thereon.

To achieve the above object, a socket assembly, adapted for electrically connecting a package to a printed circuit board, comprises a socket, a package received in the socket, at least one linking member, and a pressing member. The pressing member is disposed upon the package and defines at least one arch groove. The at least one linking member passes through the at least one arch groove to retain the passing member on the printed circuit board, and the pressing member is able to rotate, by sliding the at least one arch groove with respect to the at least one linking member.

Other objects, advantages and novel features of the invention will become more apparent from the following detailed description of a preferred embodiment when taken in conjunction with the accompanying drawings.

DETAILED DESCRIPTION OF THE INVENTION

Figure 1:
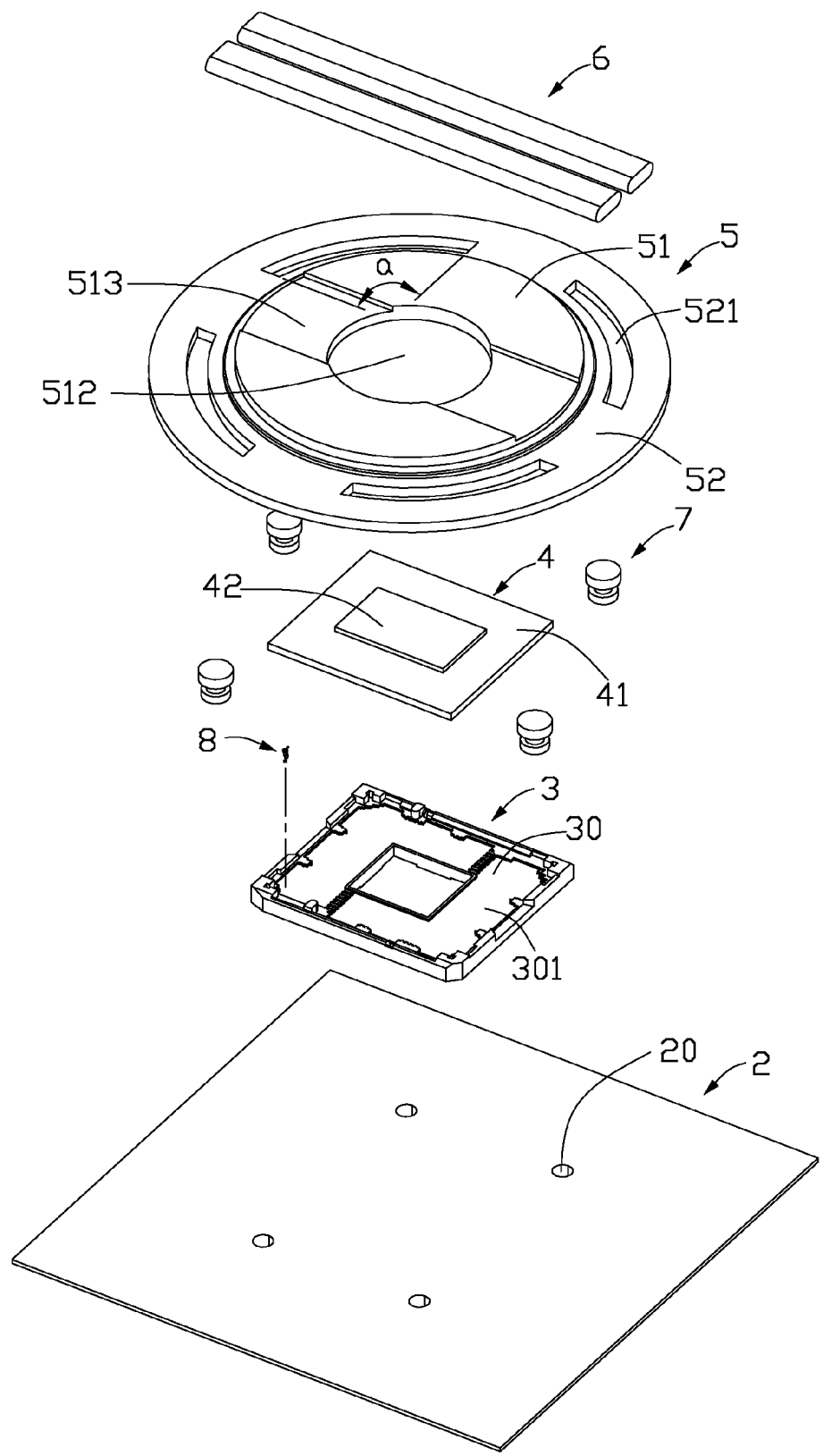
FIG. 1 is an exploded, perspective view of a socket assembly in accordance with present invention.

Referring to FIG. 1, a socket assembly 1 made in accordance with present invention is disclosed, the socket assembly 1 is used for electrically connecting a package 4 and a printed circuit board 2, and comprises a socket 3 for receiving the package 4 therein, a pressing member 5 disposed upon the package 4, two heat pipes 6 attached to the pressing member 5 and a plurality of linking members 7 for retaining the pressing member 5 to the printed circuit board 2.

The socket 3 is mounted on the printed circuit board 3, which has a plurality of holes 20 beside a peripheral of the socket 3. The socket 3 has an insulative housing 30 with a cavity 301 and a plurality of terminals (not shown) assembled within the insulative housing 30. The package 4 is accommodated in the cavity 301 to contact with the terminals (not shown), and the package 4 is configured with a substrate plate 41 having a planar configuration and a die portion 42 protruding from the center of the substrate plate 41.

Figure 4:
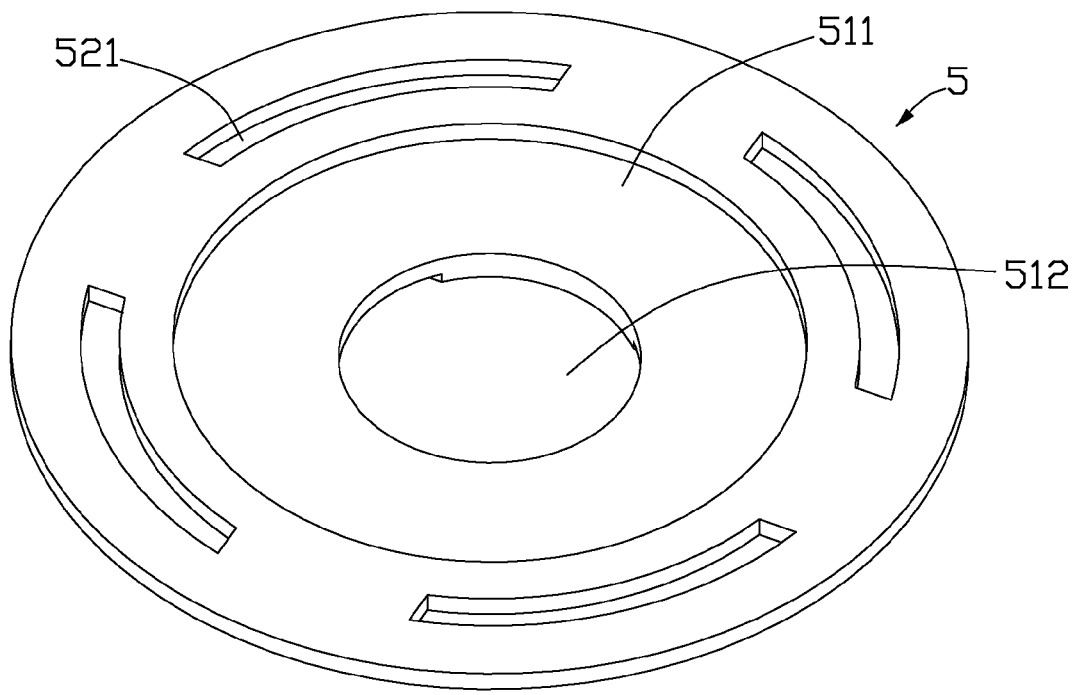
FIG. 4 is a perspective view of the pressing member of the socket assembly, taken from a bottom side.

Conjoined with FIG. 4, the pressing member 5 is disposed on the top of the package 4, and has a circular shape with two circular shoulders, including a first step 51 in the center of the pressing member 5, and a lower second step 52 on a peripheral of the pressing member 5 and around the first step 51. A circular space 511 is defined under the first step 51, and an opening 512 passes through the middle of the circular space 511. The first step 51 has a mounting area 513 recessed from a top surface thereof and extending in a diameter direction. The second step 52 has a plurality through arch grooves 521, which are in an imaginary circle and symmetrical relative to the center of the imaginary circle. The linking member 7, such as a bolt, passes through the groove 521 and engages with the hole 20 of the printed circuit board 2, thus the pressing member 5 is rotatablely retained to the printed circuit board 2.

Figure 6:
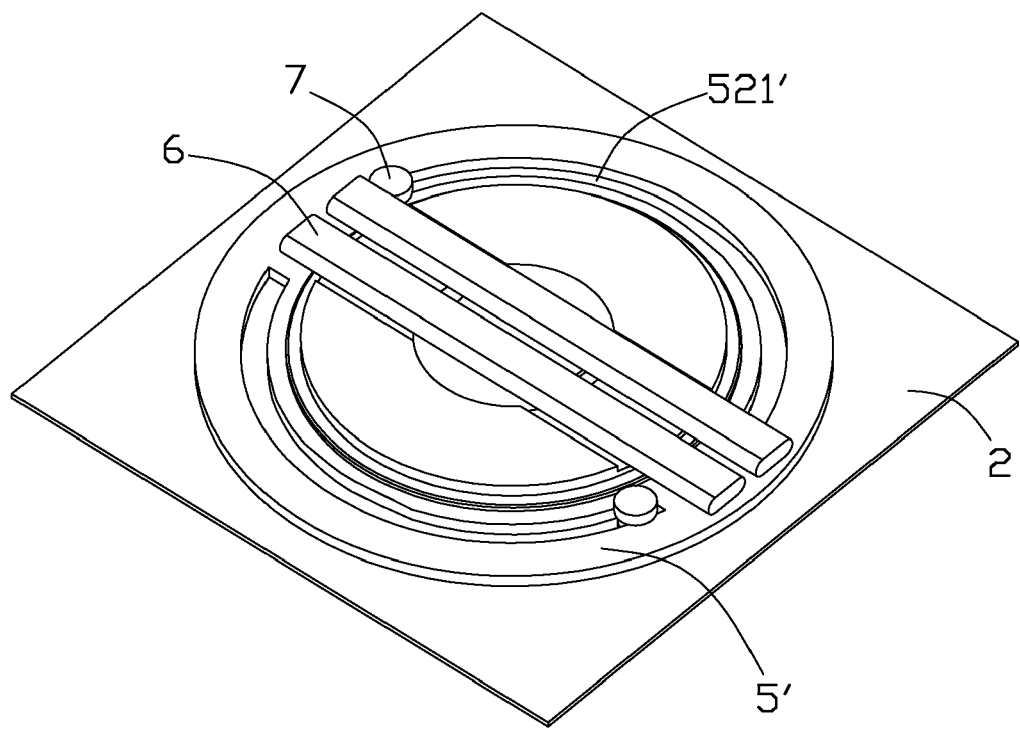
FIG. 6 is a perspective view of an alternative pressing member.

A central angle a defined by the arch groove 521 decides a rotation range of the pressing member 5, as a result, an user may design a certain length of the arch grooves 521 so as to obtain different rotation range of the pressing member 5. The pressing member 5 in FIG. 2 has four arch grooves 521, therefore the pressing member 5 can rotate within 90 degrees; while FIG. 6 discloses another alternative pressing member 5' with two arch grooves 521', so that the another pressing member 5' can rotate within 180 degrees relative to the linking member 7, the printed circuit board 2, and etc. Furthermore, the arch grooves 521, 521' are not necessarily arranged in a same imaginary circle, they also can be located in different imaginary concentric circles.

Figure 5:
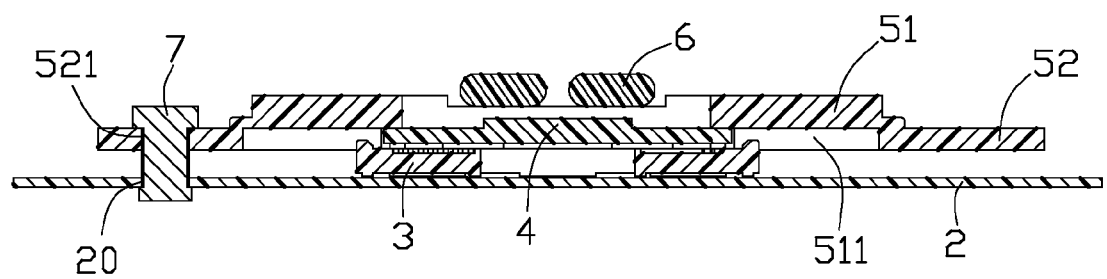
FIG. 5 is a sectional view of the socket assembly, taken from line 5-5 in FIG. 2.

Referring to FIG. 5, the pressing member 5 is assembled upon the package 4, with the package 4 partially received in the circular space 511, the die portion 42 of the package 4 stands within the opening 512; the first step 51 downwardly presses the substrate plate 41 of the package 4 to ensure that the package 4 connects with the socket 3 firmly. After assembled to the printed circuit board 2, the pressing member 5 is distant to the printed circuit board 2, thereby allowing the pressing member 5 to rotate freely. The heat pipes 6 are soldered to the mounting area 513 of the pressing member 5 and orientated in a radium direction of the pressing member 5.

Figure 2:
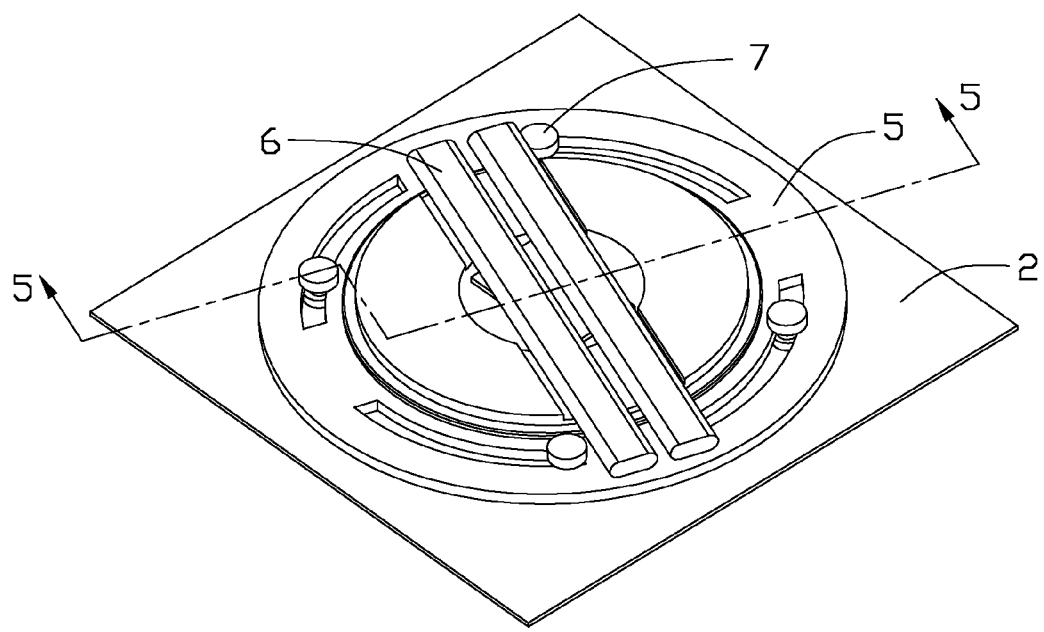
FIG. 2 is an assembled, perspective view of the socket assembly in accordance with present invention.
Figure 3:
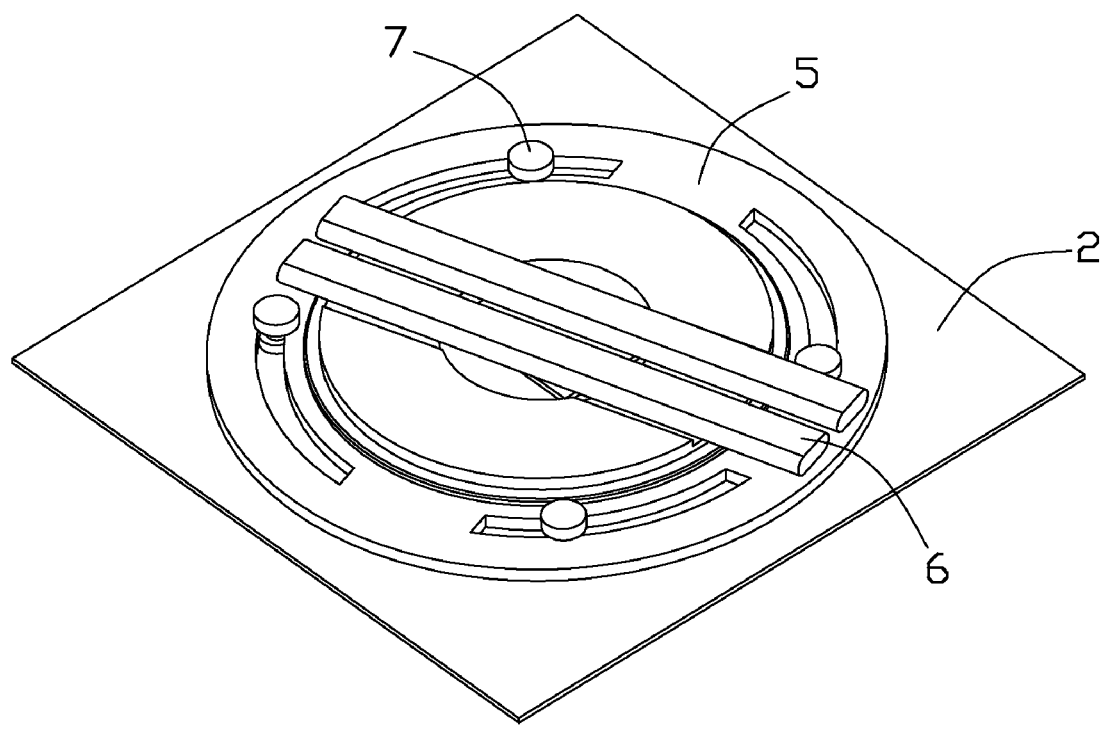
FIG. 3 is another assembled, perspective view of the socket assembly in accordance with present invention, wherein a pressing member of the socket assembly rotates to another position.

When in using, rotating the pressing member 5/5', along with the linking members 7 sliding along the grooves 521/521', till the heat pipes 6 arrive a pre-determined direction. FIG. 2 and FIG. 3 show a primary position and another position where the pressing member 5 rotates counterclockwise to a certain angle from the primary position, respectively. The pressing member 5/5' of the socket assembly 1 can provide a flexible arrangement for the heat pipes 6, user can adjust a direction of the heat pipes 6 after the socket assembly 1 is assembled on the printed circuit board 2, so the socket assembly 1 is capable of mounting onto different computers.

However, the disclosure is illustrative only, changes may be made in detail, especially in matter of shape, size, and arrangement of parts within the principles of the invention.

What is claimed is:

1. A socket assembly, adapted for electrically connecting a package to a printed circuit board, comprising:
   a socket;
   a package received in the socket;
   at least one linking member separated from the socket and assembled to the printed circuit board; and
   a pressing member disposed upon the package and defining at least one arch groove, the at least one linking member passing through the at least one arch groove to retain the pressing member on the printed circuit board, and the pressing member being able to rotate, by sliding the at least one arch groove with respect to the at least one linking member.

2. The socket assembly as claimed in claim 1, wherein the at least one arch groove is arranged in a circle.

3. The socket assembly as claimed in claim 1, wherein when an amount of the at least one arch groove is more than two, these arch grooves can be arranged in concentric circles.

4. The socket assembly as claimed in claim 1, wherein an amount of the at least one pressing member is two, the pressing member together with a heat pipe attached to the pressing member is able to rotate within 180 degrees.

5. The socket assembly as claimed in claim 1, wherein an amount of the at least one pressing member is four, the pressing member together with a heat pipe attached to the pressing member is able to rotate within 90 degrees.

6. The socket assembly as claimed in claim 1, wherein the pressing member has a circular shape with circular steps, including a first step in the center of the pressing member, and a lower second step on the peripheral of the pressing member and around the first step.

7. The socket assembly as claimed in claim 6, further comprising a heat pipe, the first step has a mounting area recessed from a top surface thereof and extending in a diameter direction, the heat pipe is soldered to the mounting area.

8. The socket assembly as claimed in claim 6, wherein a circular space is defined under the first step to receive the package.

9. The socket assembly as claimed in claim 8, wherein an opening passes through the middle of the circular space.

10. The socket assembly as claimed in claim 7, wherein the package has a substrate pressed by the first step and a die portion standing within the opening.

11. A heat dissipating system, for being disposed upon a package received in a socket mounted on a printed circuit board, comprising:
    a pressing member defining a groove passing therethrough in a top-to-bottom direction;
    a linking member downwardly passing through the groove and fixed to the printed circuit board to retain the pressing member on the printed circuit board; and
    at least one heat pipe attached to the pressing member; wherein
    when the pressing member rotates after retained to the printed circuit board, the linking member slides along the groove relative to the pressing member.

12. The heat dissipating system as claimed in claim 11, wherein a central angle defined by the groove decides a rotation range of the pressing member.

13. The heat dissipating system as claimed in claim 11, wherein the pressing member has a circular shape with circular steps, including a first step in the center of the pressing member, and a lower second step on the peripheral of the pressing member and around the first step.

14. The heat dissipating system as claimed in claim 13, wherein the first step has a mounting area recessed from a top surface thereof and extending in a diameter direction, the at least one heat pipe is soldered to the mounting area.

15. The heat dissipating system as claimed in claim 13, wherein a circular space is defined under the first step to receive the package, an opening passes through the middle of the circular space.

16. The heat dissipating system as claimed in claim 15, wherein the package has a substrate pressed by the first step and a die portion standing within the opening.

17. An electrical connector assembly comprising:
    a printed circuit board;
    an electrical connector mounted upon the printed circuit board
    a linking member formed with the printed circuit board beside the connector;
    an electronic package electrically and mechanically connected upon the connector; and
    a pressing member with a heat dissipation device associated secured thereto, being assembled to the printed circuit board under condition that the pressing member is urged downwardly toward the printed circuit board by the linking member but is resisted by the electronic package which tightly abuts against pressing member for efficient heat transfer therebetween, wherein
    the heat dissipation device is fully exposed upon the pressing member so that securement between the heat dissipation device and the pressing member is not affected by rotation of the pressing member relative to the linking member from a first position to a second position.

18. The electrical connector assembly as claimed in claim 17, wherein one of said linking member and said pressing member includes a set of posts, and the other includes a set of grooves receiving and interlocking the set of posts, respectively, under condition that the posts are allowed to be movable in the corresponding grooves, respectively, when the pressing member is moved from the first position to the second position relative to the printed circuit board.

19. The electrical connector assembly as claimed in claim 17, wherein the linking member and pressing member are essentially spaced from the connector.

* * * * *